United States Patent [19]

Phillips et al.

[11] Patent Number: 5,777,856
[45] Date of Patent: *Jul. 7, 1998

[54] INTEGRATED SHIELDING AND MECHANICAL SUPPORT

[75] Inventors: James P. Phillips, Lake In The Hills; Thomas J. Walczak, Woodstock; Michael W. Schellinger, Arlington Heights; Scott Semenik, Lake Zurich; Thomas Carey Reardon, deceased, late of Marengo, all of Ill., by Mary Ann K. Reardon

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 692,548

[22] Filed: Aug. 6, 1996

[51] Int. Cl.⁶ .................................................. H05K 9/00
[52] U.S. Cl. .......................... 361/816; 361/741; 361/742; 361/752; 361/753; 361/756; 361/759; 361/796; 361/799; 361/801; 361/802; 361/814; 361/818
[58] Field of Search .................................. 361/212, 220, 361/736, 740, 741, 742, 747, 752, 753, 756, 759, 784, 790, 796, 799, 800–803, 814, 816, 818; 174/35 R, 35 GC, 357 S; 379/433, 428, 434; 333/246, 112; 455/89, 90, 300–301, 348, 128; 307/91

[56] References Cited

U.S. PATENT DOCUMENTS

| | | | |
|---|---|---|---|
| 4,138,681 | 2/1979 | Davidson et al. | 343/702 |
| 4,730,195 | 3/1988 | Phillips et al. | 343/792 |
| 5,124,889 | 6/1992 | Humbert et al. | 361/818 |
| 5,383,098 | 1/1995 | Ma et al. | 361/818 |

FOREIGN PATENT DOCUMENTS 0 371 708   6/1990   European Pat. Off. .

OTHER PUBLICATIONS

Peters, "Field Configuration", Handbook of Tri–Plate Microwave Components, pp. 2–3.

*Primary Examiner*—Leo P. Picard
*Assistant Examiner*—Phuong T. Vu
*Attorney, Agent, or Firm*—Sylvia Chen

[57] ABSTRACT

The integrated shielding and mechanical support simultaneously addresses the problems of providing RF shielding for an electronic device such as a radio transceiver and providing a rigid mechanical assembly for the electronic device. Two conductive rails (120, 130) hold together multiple printed circuit boards (PCBs) (140, 160) having conductive layers (145, 165) to produce a four-sided shielding box (180) that protects certain electronic circuits on the PCBs from electromagnetic interference. An internal conductive shield (150) subdivides the inside of the shielding box to provide additional protection for sensitive circuitry. The shielding box inserts into an opening in a five-sided housing section (110) using guides (112, 114, 116, 118), which simplifies assembly of PCBs in the housing and facilitates automated assembly. A second housing section (190) attaches to the shielding box (180) once it is inserted into the five-sided housing section (110).

24 Claims, 4 Drawing Sheets

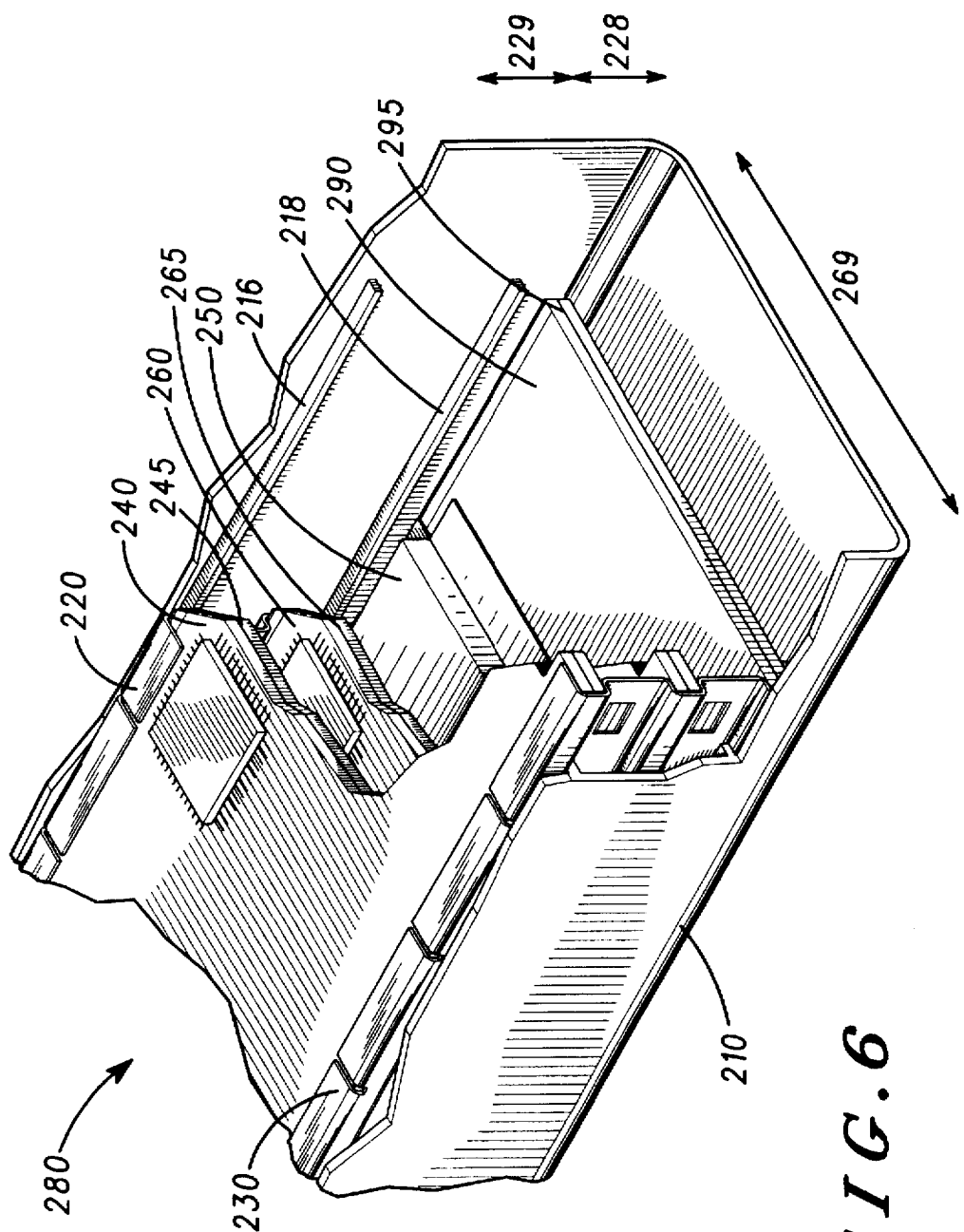

INTEGRATED SHIELDING AND MECHANICAL SUPPORT

FIELD OF THE INVENTION

This invention relates generally to electrical shieldings and mechanical housings for electronic devices, and more specifically to an integrated shield and mechanical support for use in an electronic device.

BACKGROUND OF THE INVENTION

Complex electronic apparatus have various circuits with varied levels of vulnerability to extraneous currents flowing in their location and other forms of electromagnetic interference (EMI). In radio transceiver designs, for example, the radio frequency (RF) performance of a transceiver is dependent on the RF shielding characteristics of the housing. In this example, EMI is typically caused by the radio transceiver itself or by other nearby electronic devices that generate electromagnetic fields. Conductive shields are often used to protect and separate individual circuits that are located in close proximity to one another or to an antenna or another source of EMI. These shields, however, add to the cost and complexity of electronic equipment and are generally regarded as an unavoidable nuisance. Thus, there is a continuous effort to reduce the need for electrical shielding.

In addition to the electrical problems described above, radio transceivers and other electronic devices encounter various mechanical issues. Mechanical housings should enhance electrical isolation to reduce EMI, reduce the need for conductive coatings on inside housing surfaces, and have easy-to-assemble parts made from a minimal amount of housing material. In conventional housings, however, multiple housing sections are connected together using plastic tabs and slots, which require duplicate walls, or screws, which are difficult to assemble. In conclusion, there is a need for conductive shieldings and mechanical housings that provide proper electrical isolation for electronic devices with minimal cost and complexity.

BRIEF DESCRIPTION OF THE DRAWINGS

FIG. 6 shows an cut-away view of an integrated shielding and mechanical support according to another preferred embodiment.

DETAILED DESCRIPTION OF THE PREFERRED EMBODIMENTS

The integrated shielding and mechanical support simultaneously addresses the two problems of providing RF shielding for a radio transceiver or other electronic device and providing a rigid mechanical assembly for the device. Conductive rails hold together multiple printed circuit boards (PCBs), each having a ground layer, to produce a four-sided conductive box with cross-sectional dimensions that preclude electromagnetic fields of certain wavelengths from entering the box and producing EMI. The shielding box is integrated into a housing to provide both mechanical support for the electronic device and ground electrical connections.

The integrated shielding and mechanical support allows a housing section to be an open assembly with five sides, which produces a more mechanically rigid housing. The shielding box can slide into the opening in the five-sided housing section which simplifies assembly of PCBs in a housing and facilitates automated assembly. The integrated shielding and mechanical support also provides for a method of connecting two separate housing sections simply and efficiently, assists in providing areas of electrical isolation, and eliminates the need for conductive coatings on inside housing surfaces.

Figure 1:
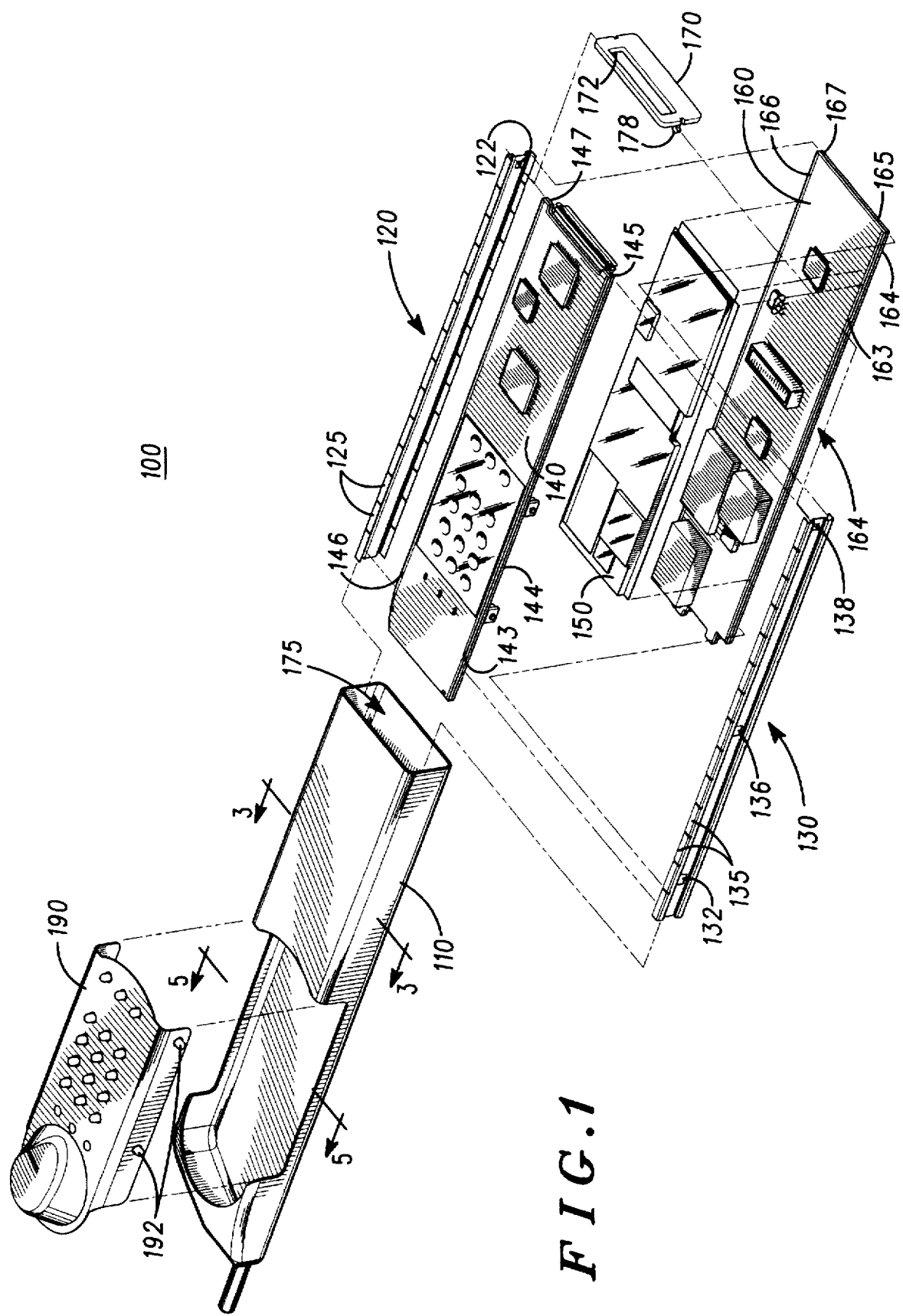
FIG. 1 shows an exploded view of an integrated shielding and mechanical support according to a preferred embodiment as used in an electronic device.

FIG. 1 shows an exploded view of an integrated shielding and mechanical support according to a preferred embodiment as used in an electronic device. Although a portable radiotelephone is shown as the electronic device 100 in this drawing, the integrated shield and mechanical support can be used in any device that requires electrical shielding such as a television set, computer, recording instrument, or cordless telephone.

A first housing section 110 having five sides, in conjunction with a second housing section 190 and an end section 170, contains electrical circuitry used by the portable radiotelephone. Preferably, the housing sections are constructed from plastic or other non-conductive materials. The circuitry, including radio transceiver and antenna connections, is positioned on PCBs 140, 160. Preferably, PCBs 140, 160 are multi-layer circuit boards each having one conductive layer 145, 165. The conductive layers are extended to the edges of the PCBs to provide top connection areas 143, 146, 163, 166. Preferably, connections areas are provided on both sides of each PCB, thus bottom connection areas 144, 147, 164, 167 are included opposite the top connection areas.

Internal shield 150 couples to one or more of the connection areas 143, 144, 146, 147, 163, 164, 166, 167. Preferably the internal shield 150 is created from conductive material or a nonconductive form with a conductive coating, and it provides an area of increased RF isolation for extremely sensitive electrical components on the upper surface of PCB 160. Preferably, internal shield 150 is custom configured and oriented depending on where sensitive components are located. In certain applications, an internal shield is not needed to provide additional electronic isolation of components, however, in many applications internal shield 150 allows use of circuit arrangement alternatives that may otherwise be unavailable.

Conductive rails 120, 130 support and ground PCBs 140, 160 through connection areas 143, 144, 146, 147, 163, 164, 166, 167 and internal shield 150. The rails may also ground other sections of the radio transceiver as needed. For example, the rails can also ground the antenna, battery contacts, or battery connections. Rails 120, 130 preferably are serpentine in cross-section, install on opposing edges of the PCBs, and clip onto the PCBs with spring tension. A rail with a C-shaped cross-section or another shape, however, can substitute for a rail with a serpentine cross-section. Spring clips on the rails promote simple assembly and are easily removed for inspection or service. Preferably the clips are crenelated 125, 135 to allow maximum flexibility, however, other types of spring clip mechanisms can be used. Alternate methods of fastening the rails to the PCBs, such as screws or conductive adhesive, are also available. Thus, properly assembled, the PCBs 140, 160 and the rails 120, 130 form a four-sided box 180 shown in FIG. 2 useful for shielding sensitive electronic circuitry.

Figure 2:
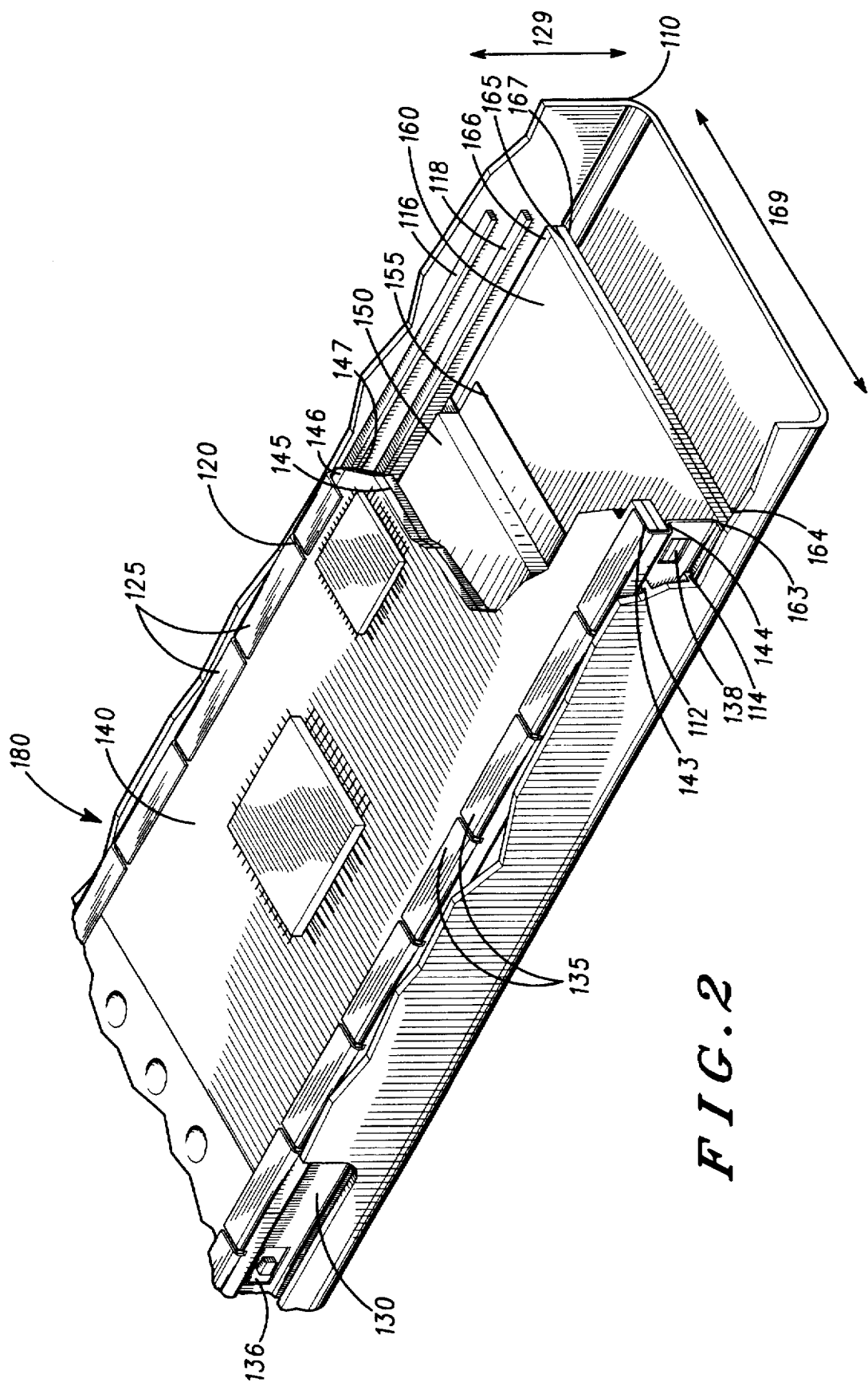
FIG. 2 shows a cut-away view of an integrated shielding and mechanical support according to a preferred embodiment.

FIG. 2 shows a cut-away view of an integrated shielding and mechanical support according to a preferred embodiment. Parallel rails 120, 130 have crenelated spring clips 125, 135 connected to parallel PCBs 140, 160 having conductive layers 145, 165. These parts form an RF shielding box 180. The shielding box 180 provides an enclosure to protect sensitive electronic circuits from external electromagnetic waves or ground currents from an attached antenna. By using two multi-layer PCBs 140, 160 for two opposite sides of a shielding box 180, a conductive layer 145, 165 in each board can be used as a conductive surface of the box. Central conductive layers are most attractive because they allow the maximum number of layers for circuit interconnection on each side of the PCB.

The shielding box 180 may be supplemented using various configurations for internal shield 150 held in place by rails 120, 130. For example, internal shield 150 may have regions that either partially cover or fully cover circuitry on PCB 160 or openings to allow inter-board connections between PCB 140 and PCB 160. As shown in FIG. 2, a region of internal shield 150 is connected to conductive layer 165 through connection area 155 using conductive adhesive.

The shielding box 180 needs only to be four sided if the open ends are at equal potential planes and the cross-sectional dimensions of the enclosure prevent the intrusion of electromagnetic energy having wavelengths that interfere with the operation of the electronic device. If the cross-section of the shielding box 180 is smaller than a half-wavelength of the highest frequency of interest, it prevents propagation of wave guide modes (TMnm or TEnm). In other words, the maximum distance 169 between rails 120, 130 and the maximum distance 129 between conductive layers 145, 165 are less than one half-wavelength. Thus, a properly proportioned four-sided shielding box 180 can be substituted for a fullyclosed, six-sided box. If desired, however, a four-sided shielding box 180 can be closed off by adding a conductive layer to end section 170 shown in FIG. 1 and placing a similar conductive end section on the shielding box 180 opposite end section 170.

When shielding box 180 is completed, certain electronic circuitry will be inside the shielding box and other electronic circuitry will be outside of the box. For a portable radiotelephone application, low-speed digital or other noise-tolerant electronic circuitry preferably is placed on the outside of the shielding box along with more robust circuitry such as a duplexer, transmitter power amplifier, and transmitter driver. Meanwhile, more sensitive circuitry such as a receiver and analog circuitry that is not tolerant of high levels of noise are placed inside the box and thus shielded from EMI. Internal shield 150 subdivides the inside region and reduces interference between circuitry on the bottom of PCB 140 and the top of PCB 160.

Once the shielding box 180 is formed, the box fits into the open sixth side of the first housing section 110 having five sides. Preferably, the box slides into first housing section 110 through opening 175 shown in FIG. 1. Rails 120, 130, as positioned inside first housing section 110, support second housing section 190 and end housing section 170. Openings 132, 136 in the rails 120, 130 facilitate electrical and/or mechanical connections between buttons 192 in housing section 190 and the circuitry on PCBs 140, 160. Openings 122, 138 in rails 120, 130 function as fastening slots for tabs 172, 178 of end housing section 170. A separate antenna attaches to the PCBs once the PCBs and the housing sections are secured. Thus, the shielding box is integral with the mechanical housing of the radio transceiver.

Figure 3:
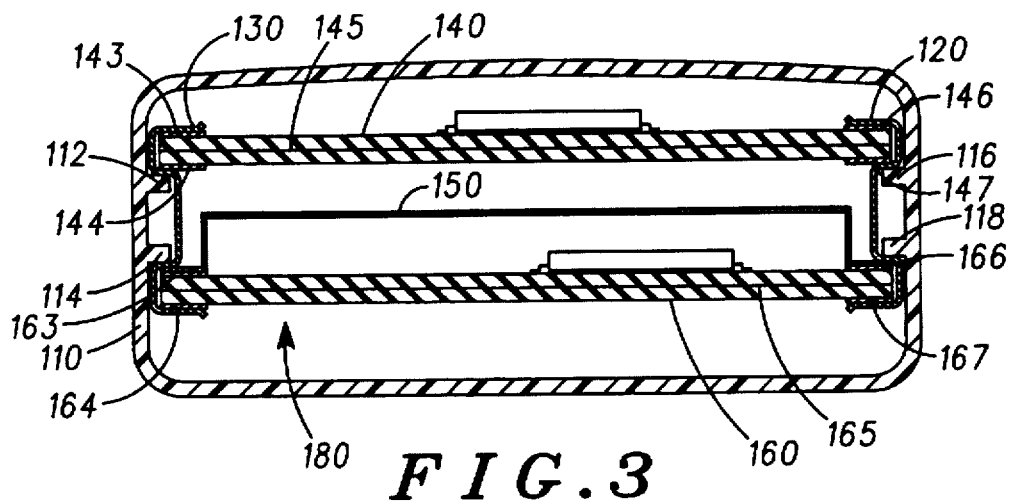
FIG. 3 shows a first cross section of an integrated shielding and mechanical support according to a preferred embodiment.

FIG. 3 shows a first cross section of an integrated shielding and mechanical support according to a preferred embodiment. This cross section is taken along line 3—3 shown in FIG. 1. The inner surface of first housing section 110 has two double guides 112, 114 and 116, 118 that interact with rails 120, 130 to provide secure fit and accurate positioning of the shielding box 180 inside first housing section 110. The close fit of the guides and the rails allow the PCBs to provide strength and stiffness to the electronic device housing in all three bending planes. The fit also makes it impossible for the rails 120, 130 to disengage from the PCBs 140, 160 once the unit is assembled. Although each rail is shown to interact with a double guide, other configurations can be used to secure the shielding box 180 inside the housing. For example, a length of double guide may be replaced with a single guide or several short lengths of guide or tabs.

Note that only one surface of internal shield 150 needs to be conductive. If internal shield 150 is made from a non-conductive form with a conductive coating, conductive coating may be applied to only one surface of the internal shield. If the bottom surface of internal shield 150 is conductive, the shield grounds directly to connection areas 163, 166 on the top surface of PCB 160. If the top surface of internal shield 150 is conductive, the shield grounds to rails 120, 130, which are grounded to connection areas 164, 167 on PCB 160. Making both surfaces of internal shield 150 conductive, however, provides an additional measure of security that the internal shield is properly grounded.

Note that serpentine rails 120, 130 interact with all eight connection areas 143, 144, 146, 147, 163, 164, 166, 167 on PCBs 140, 160. This supplies redundant ground connections between shielding box components. If rails 120, 130 were configured alternately as C-shaped rather than serpentine, the rails would interact with four connection areas, which would still provide proper shielding.

Figure 4:
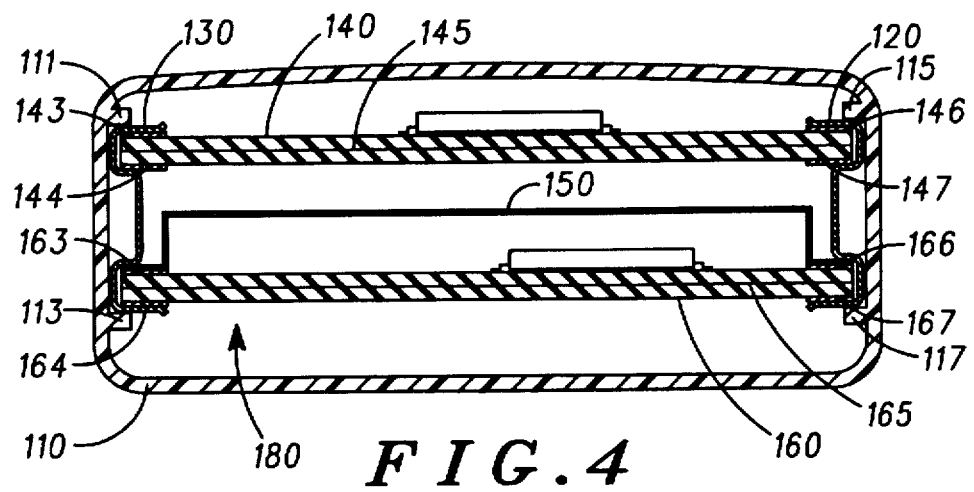
FIG. 4 shows an alternate first cross section of an integrated shielding and mechanical support according to a preferred embodiment.

FIG. 4 shows an alternate first cross section of an integrated shielding and mechanical support according to a preferred embodiment. This alternate cross section is similar to the cross section shown in FIG. 3; this cross section is also taken along line 3—3 shown in FIG. 1. Instead of the guides engaging the rails at the center, however, guides 111, 113, 115, 117 engage rails 120, 130 at the perimeter of the rails.

Figure 5:
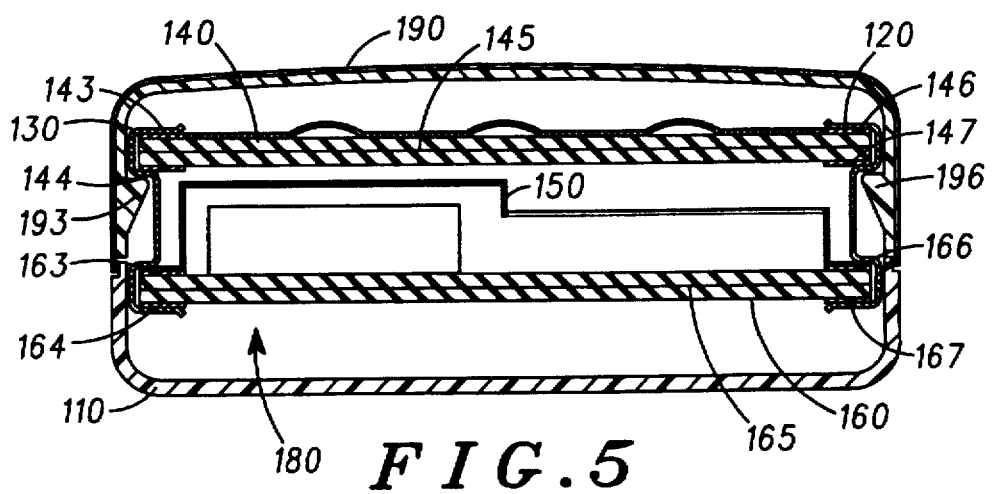
FIG. 5 shows a second cross section of an integrated shielding and mechanical support according to a preferred embodiment.

FIG. 5 shows a second cross section of an integrated shielding and mechanical support according to a preferred embodiment. This cross section is taken along line 5—5 shown in FIG. 1. Once the shielding box 180 is fastened inside the first housing section 110, the shielding box 180 mechanically supports second housing section 190. Second housing section 190 includes fastening sections 193, 196 such as snaps that attach to rails 120, 130. Of course other types of fasteners, such as screws or adhesives, may be substituted for snaps.

FIG. 6 shows a cut-away view of an integrated shielding and mechanical support according to another preferred embodiment. In this embodiment, three PCBs 240, 260, 290 with conductive layers 245, 265, 295 are connected using two rails 220, 230 to create a shielding box 280. This embodiment provides additional areas of electrical isolation, namely, outside of the shielding box, inside the shielding box above PCB 260, and inside the shielding box below PCB 260. Using internal shield 250 extends the isolation of the electrical circuitry inside the shielding box below PCB 260 if desired. Internal shield 250 is identical to internal shield 150 described previously. Of course, an internal shield can be in the shielding box above PCB 260.

PCBs and internal shields can be stacked indefinitely with minor adjustments to the rails. As long as the cross-sectional area between consecutive PCBs is smaller than a half-wavelength, the conductive layers in the PCBs will prevent wave guide mode propagation within the shielding box 280. In other words, the maximum distance 269 between rails 220, 230, the maximum distance 228 between adjacent conductive layers 265, 295, and the maximum distance 229 between adjacent conductive layers 245, 265 all must be less than a half-wavelength of the highest frequency of interest. Shielding box 280 fits into housing section 210 using guides 216, 218 similar to those described previously.

Thus an integrated shielding and mechanical support provides both electrical isolation for electronic circuitry and mechanical support with minimal cost and complexity. While specific components and functions of the integrated shielding and mechanical support are described above, fewer or additional functions could be employed by one skilled in the art within the true spirit and scope of the present invention. The invention should be limited only by the appended claims.

We claim:

1. An integrated shielding and mechanical support for an electronic device having a highest frequency of interest for operation comprising:

A. a shielding box comprising:

a first printed circuit board having a first conductive layer;

a second printed circuit board having a second conductive layer;

a first conductive rail connected to the first conductive layer and the second conductive layer; and a second conductive rail connected to the first conductive layer and the second conductive layer, the second conductive rail being separate and distinct from the first conductive rail, wherein the second conductive rail does not mechanically contact the first conductive rail, wherein a maximum distance between the first conductive layer and the second conductive layer is less than a half-wavelength of the highest frequency of interest, and a maximum distance between the first conductive rail and the second conductive rail is less than the half-wavelength of the highest frequency of interest; and B. a housing surrounding a portion of the shielding box and supported by the shielding box.

2. An integrated shielding and mechanical support according to claim 1 wherein the first printed circuit board is oriented parallel to the second printed circuit board.

3. An integrated shielding and mechanical support according to claim 1 wherein the first conductive rail is oriented parallel to the second conductive rail.

4. An integrated shielding and mechanical support according to claim 1 wherein the housing comprises:

a first guide protruding from an inner circumference of the housing for engaging with one side of the shielding box.

5. An integrated shielding and mechanical support according to claim 4 wherein the first guide engages the first conductive rail.

6. An integrated shielding and mechanical support according to claim 4 wherein the first guide comprises:

a double guide.

7. An integrated shielding and mechanical support according to claim 4 wherein the housing further comprises:

a second guide protruding from an inner circumference of the housing for engaging with another side of the shielding box.

8. An integrated shielding and mechanical support according to claim 1 further comprising:

a non-planar internal conductive shield electrically connected to the first conductive rail.

9. An integrated shielding and mechanical support according to claim 8 wherein the non-planar internal conductive shield electrically connects to the second conductive rail.

10. An integrated shielding and mechanical support according to claim 1 wherein the first conductive layer is a central layer of the first printed circuit board.

11. An integrated shielding and mechanical support according to claim 10 wherein the second conductive layer is a central layer of the second printed circuit board.

12. An integrated shielding and mechanical support according to claim 1 wherein the first conductive rail comprises:

a spring clip.

13. An integrated shielding and mechanical support according to claim 12 wherein the second conductive rail comprises:

a spring clip.

14. An integrated shielding and mechanical support according to claim 13 wherein the spring clip of the second conductive rail is crenelated.

15. An integrated shielding and mechanical support according to claim 12 wherein the spring clip of the first conductive rail is crenelated.

16. An integrated shielding and mechanical support according to claim 1 wherein the first conductive rail has a serpentine cross section.

17. An integrated shielding and mechanical support according to claim 16 wherein the second conductive rail has a serpentine cross section.

18. An integrated shielding and mechanical support according to claim 1 further comprising:

a second housing section connected to the shielding box.

19. An integrated shielding and mechanical support according to claim 18 wherein the second housing section comprises:

a first fastening section engaging with the first conductive rail; and a second fastening section engaging with the second conductive rail.

20. An integrated shielding and mechanical support according to claim 1 further comprising:

a third printed circuit board having a third conductive layer, wherein the first conductive rail is connected to the third conductive layer, and the second conductive rail is also connected to the third conductive layer.

21. A radiotelephone comprising:

A. a shielding box comprising:

a first printed circuit board having a first conductive layer;

a second printed circuit board, oriented parallel to the first printed circuitboard, having a second conductive layer;

a first conductive rail having a spring clip connected to the first conductive layer and the second conductive layer;

a second conductive rail having a spring clip connected to the first conductive layer and the second conductive layer, the second conductive rail being separate and distinct from the first conductive rail; wherein the second conductive rail does not mechanically contact the first conductive rail, and an internal conductive shield coupled to the first conductive layer, wherein a maximum distance between the first printed circuit board and the second printed circuit board and a maximum distance between the first conductive rail and the second conductive rail are less than a half-wavelength of a highest frequency of interest; and B. a housing having guides engaging with the first conductive rail and the second conductive rail, wherein the shielding box supports the housing, and the housing surrounds the shielding box.

22. A method for assembling an integrated shielding and mechanical support system comprising the steps of:

A. forming a shielding box comprising the steps of:

attaching a first conductive rail to a first conductive layer of a first printed circuit board and a second conductive layer of a second printed circuit board that is oriented parallel to the first printed circuit board; and attaching a second conductive rail, oriented parallel to the first conductive rail, to the first conductive layer of the first printed circuit board and the second conductive layer of the second printed circuit board the second conductive rail being separate and distinct from the first conductive rail wherein the second conductive rail does not mechanically contact the first conductive rail, and B. positioning the shielding box in a housing section having a inwardly protruding guide, wherein the shielding box engages with the guide and supports the housing.

23. A method for assembling an integrated shielding and mechanical support according to claim 22 wherein the step of positioning further comprises:

inserting the shielding box through an opening in a five-sided housing section.

24. A method for assembling an integrated shielding and mechanical support according to claim 23 further comprising the step of:

attaching a second housing section to the shielding box after the step of inserting.

* * * * *